(12) United States Patent
Kubo et al.

(10) Patent No.: US 8,720,537 B2
(45) Date of Patent: May 13, 2014

(54) GRAPHITE SHEET AND HEAT TRANSFER STRUCTURE USING SAME

(75) Inventors: Kazuhiko Kubo, Hokkaido (JP); Yuichi Sato, Hokkaido (JP); Norihiro Kawamura, Hokkaido (JP); Masashi Funaba, Hokkaido (JP)

(73) Assignee: Panasonic Corporation, Osaka (JP)

( * ) Notice: Subject to any disclaimer, the term of this patent is extended or adjusted under 35 U.S.C. 154(b) by 426 days.

(21) Appl. No.: 13/143,880

(22) PCT Filed: Jun. 30, 2010

(86) PCT No.: PCT/JP2010/004307
§ 371 (c)(1),
(2), (4) Date: Jul. 8, 2011

(87) PCT Pub. No.: WO2011/007510
PCT Pub. Date: Jan. 20, 2011

(65) Prior Publication Data
US 2011/0265980 A1 Nov. 3, 2011

(30) Foreign Application Priority Data

Jul. 13, 2009 (JP) ................................. 2009-164753

(51) Int. Cl.
*F28F 7/00* (2006.01)
*H05K 7/20* (2006.01)
(52) U.S. Cl.
USPC ............................. 165/185; 165/133; 361/704
(58) Field of Classification Search
USPC ......... 165/80.3, 185, 133, 135; 277/405, 418, 277/627; 428/137; 257/705, 706; 174/16.3; 361/704, 713
See application file for complete search history.

(56) References Cited

U.S. PATENT DOCUMENTS

| | | | | |
|---|---|---|---|---|
| 4,463,959 A | * | 8/1984 | Usher et al. | 277/608 |
| 4,471,837 A | * | 9/1984 | Larson | 165/185 |
| 4,842,911 A | * | 6/1989 | Fick | 428/40.4 |
| 5,975,201 A | * | 11/1999 | Roberts et al. | 165/185 |
| 6,565,099 B1 | * | 5/2003 | Ottinger et al. | 277/608 |

(Continued)

FOREIGN PATENT DOCUMENTS

| CN | 1902752 A | 1/2007 |
|---|---|---|
| CN | 101448380 A | 6/2009 |

(Continued)

OTHER PUBLICATIONS

English Translation of Search Report associated with Chinese Office Action issued in Chinese Patent Application No. 201080016706.7 mailed Nov. 5, 2013.

*Primary Examiner* — Tho V Duong
(74) *Attorney, Agent, or Firm* — McDermott Will & Emery LLP

(57) ABSTRACT

A graphite sheet preventing leakage of a heat radiating member when a fluid heat radiating member such as grease is used and improving heat radiation performance is provided. A graphite sheet includes a first main surface and a second main surface opposite to the first main surface and has a large anisotropic thermal conductivity in a main surface direction. The graphite sheet includes a first concave portion provided on the first main surface and having a first bottom surface, a second concave portion provided on the second main surface and having a second bottom surface, a thin film portion formed in a region in which the first bottom surface and the second bottom surface are overlapped with each other, and a connecting hole penetrating the thin film portion and allowing the first concave portion and the second concave portion to communicate with each other.

10 Claims, 3 Drawing Sheets

(56) References Cited

U.S. PATENT DOCUMENTS

2002/0167800 A1* 11/2002 Smalc .................. 361/710
2005/0088823 A1 4/2005 Kabadi et al.

FOREIGN PATENT DOCUMENTS

| | | |
|---|---|---|
| JP | 2001-358264 | 12/2001 |
| JP | 2001-358264 A | 12/2001 |
| JP | 2004-363432 | 12/2004 |
| JP | 2005-347500 | 12/2005 |
| JP | 2006-269643 | 10/2006 |
| JP | 2006-269643 A | 10/2006 |
| JP | 2007-123516 | 5/2007 |
| JP | 2007-123516 A | 5/2007 |

\* cited by examiner

GRAPHITE SHEET AND HEAT TRANSFER STRUCTURE USING SAME

RELATED APPLICATIONS

This application is the U.S. National Phase under 35 U.S.C. §371 of International Application No. PCT/JP2010/004307, filed on Jun. 30, 2010 which in turn claims the benefit of Japanese Application No. 2009-164753, filed on Jul. 13, 2009, the disclosures of which Applications are incorporated by reference herein.

TECHNICAL FIELD

The present invention relates to a heat radiation sheet used for thermal connection between a heat generator and a heat radiator, and, more particularly, the present invention relates to a graphite sheet and a heat transfer structure using same.

BACKGROUND ART

Recently, as electronic apparatuses such as portable telephones, PDPs, and personal computers have been demanded to have high performance and small size, electronic components such as semiconductor elements have had high performance and high density. Consequently, the amount of heat generation of electronic components is remarkably increased, and therefore it is important to suppress the increase in temperature of electronic apparatuses.

In order to suppress the increase in temperature of electronic apparatuses, a thermal connection structure shown in FIG. 8 is used. The thermal connection structure includes semiconductor package 41 incorporating a semiconductor element as a heat generator; heat sink 42 as a heat radiator; and thermal connection portion 43 for thermally connecting the heat generator and the heat radiator (see, for example, Patent Document 1).

Semiconductor package 41 is electrically connected to a conductor circuit of printed wiring board 46 via a terminal. Heat sink 42 is made of a metal such as an aluminum alloy and composed of a plate-shaped core and a plurality of plate-fins disposed upright on the core.

Thermal connection portion 43 is provided between semiconductor package 41 and heat sink 42 to improve the heat radiation performance from semiconductor package 41 to heat sink 42. Thermal connection portion 43 is brought into contact with semiconductor package 41 and heat sink 42 by tightening and pressurizing with the use of attaching components 45 such as screws.

Thermal connection portion 43 is formed of a heat radiation sheet having an excellent thermal conductivity to enhance a cooling effect. Examples of the known heat radiation sheet of this kind include pyrolytic graphite sheet 44 which is formed by firing a polymer film such as a polyimide film at high temperatures and which has a high thermal conductivity. Since pyrolytic graphite sheet 44 has flexibility, when it is pressurized in the thermal connection structure, the surface of pyrolytic graphite sheet 44 can be brought into close contact with the surfaces of semiconductor package 41 and heat sink 42.

Furthermore, a heat radiating member of fluid resin such as silicone grease and silicone oil is applied to the surface of pyrolytic graphite sheet 44. Thus, the heat radiating member enters the concavity and convexity on the surfaces of semiconductor package 41, heat sink 42 and pyrolytic graphite sheet 44 so as to reduce air space in gaps, thereby enhancing the adhesion and reducing the contact thermal resistance of thermal connection portion 43.

In particular, in order to enhance the thermal conductivity of a fluid heat radiating member, a fluid heat radiating member containing a thermal conductive filler such as high thermal conductive aluminum nitride is used. In such a case, however, since the concavity and convexity on the surface of pyrolytic graphite sheet 44 are formed in firing a polymer, gaps are not large enough to contain thermal conductive fillers. Therefore, almost all of the thermal conductive fillers move on the surface of pyrolytic graphite sheet 44 and are pushed out to the outer periphery when thermal connection portion 43 is pressurized. As a result, a thermal resistance of thermal connection portion 43 cannot be reduced.

CITATION LIST

Patent Document

[Patent Document 1] Japanese Patent Application Unexamined Publication No. 2004-363432

SUMMARY OF THE INVENTION

The present invention provides a graphite sheet capable of improving heat radiation performance of a thermal connection portion and a heat transfer structure using the same.

A graphite sheet of the present invention includes a first main surface and a second main surface opposite to the first main surface and has a large anisotropic thermal conductivity in a main surface direction. The graphite sheet includes a first concave portion provided on the first main surface and having a first bottom surface, a second concave portion provided on the second main surface and having a second bottom surface, a thin film portion formed in a region in which the first bottom surface and the second bottom surface are overlapped with each other, and a connecting hole penetrating the thin film portion and allowing the first concave portion and the second concave portion to communicate with each other.

Furthermore, a heat transfer structure of the present invention includes a thermal connection portion. The thermal connection portion includes a graphite sheet which includes a first main surface, a second main surface opposite to the first main surface, a first concave portion provided on the first main surface and having a first bottom surface, a second concave portion provided on the second main surface and having a second bottom surface, a thin film portion formed in a region in which the first bottom surface and the second bottom surface are overlapped with each other, and a connecting hole penetrating the thin film portion and allowing the first concave portion and the second concave portion to communicate with each other and which has a larger anisotropic thermal conductivity in a main surface direction; and a fluid heat radiating member filled in the first concave portion, the second concave portion and the connecting hole. The thermal connection portion is disposed in such a manner that a heat generator is brought into contact with the first main surface side of the graphite sheet.

According to the graphite sheet of the present invention, leakage of a heat radiating member can be prevented and the heat radiation performance can be improved.

DETAILED DESCRIPTION OF THE PREFERRED EMBODIMENT

Exemplary Embodiment

Figure 1:
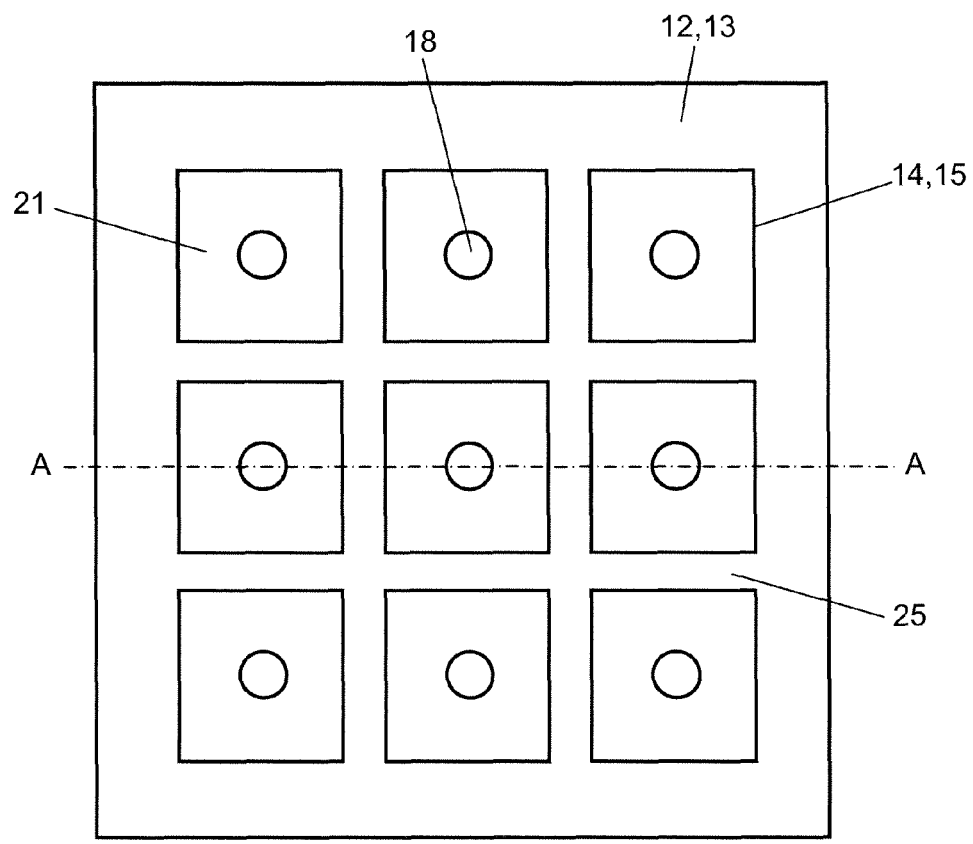
FIG. 1 is a plan view showing a graphite sheet in accordance with one exemplary embodiment of the present invention.
Figure 2:
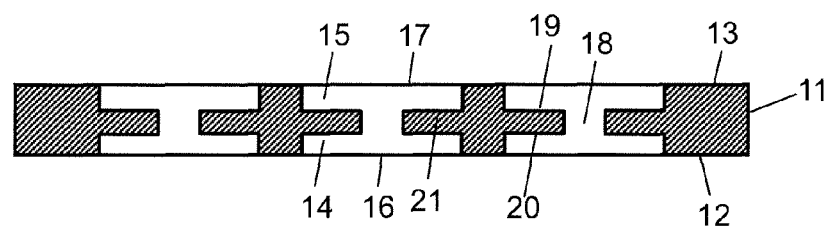
FIG. 2 is a sectional view showing the graphite sheet in accordance with one exemplary embodiment of the present invention.

A graphite sheet in accordance with one exemplary embodiment of the present invention is described. FIG. 1 is a plan view showing a graphite sheet in accordance with one exemplary embodiment of the present invention. FIG. 2 is a sectional view taken on line A-A of FIG. 1. As shown in FIGS. 1 and 2, graphite sheet 11 includes first main surface 12 and second main surface 13 opposite to first main surface 12, which are flat surfaces and parallel to each other. First main surface 12 has first concave portion 14. Second main surface 13 has second concave portion 15. First concave portion 14 has first bottom surface 19. The second concave portion has second bottom surface 20.

Furthermore, thin film portion 21 is an area in which first concave portion 14 and second concave portion 15 are overlapped with each other in at least one part in a plane seen from the direction perpendicular to first main surface 12. The thickness of thin film portion 21 is thinner than that of a part that is not provided with the concave portions. In other words, thin film portion 21 is provided in a portion in which first bottom surface 19 and second bottom surface 20 are overlapped with each other. Connecting hole 18 penetrates thin film portion 21. First concave portion 14 and second concave portion 15 communicate with each other via connecting hole 18. At least one connecting hole 18 is provided in thin film portion 21. It is preferable that an opening diameter of connecting hole 18 in the main surface direction is smaller than those of opening 16 of first concave portion 14 and opening 17 of second concave portion 15.

Thus, first concave portion 14, second concave portion 15, and connecting hole 18 form a through hole. The through hole is filled with a fluid heat radiating member.

Figure 3:
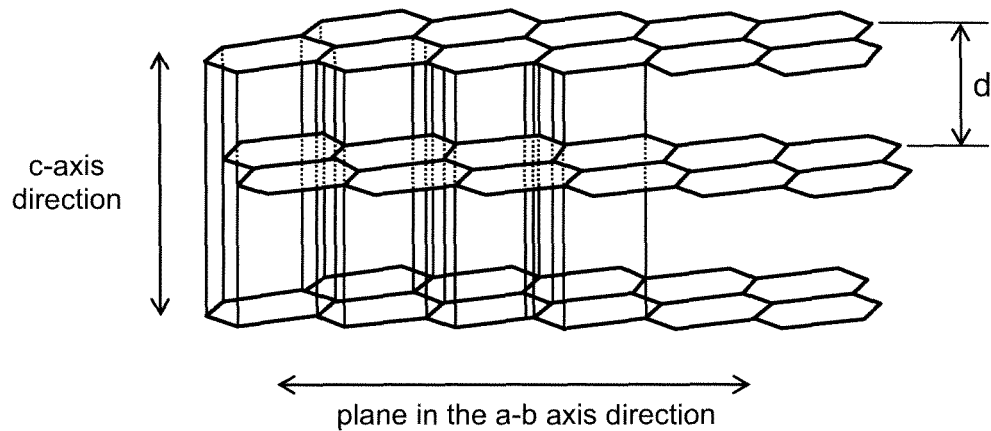
FIG. 3 is a schematic view showing a structure of graphite in accordance with one exemplary embodiment of the present invention.

Graphite sheet 11 is obtained by laminating graphite. The graphite has planes in the a-b axis direction, and each plane has hexagon arrangements of carbon atoms formed in a network structure as shown in FIG. 3. Furthermore, the planes in the a-b axis direction are arranged in parallel with substantially equal interval "d" in the c-axis direction. That is to say, the graphite is oriented to first main surface 12 and second main surface 13 substantially in parallel. The graphite is laminated, and thereby graphite sheet 11 has an anisotropic thermal conductivity. The thermal conductivity in the main surface direction is higher than the thermal conductivity in the thickness direction. Herein, the main surface direction represents a direction in parallel to first main surface 12 and second main surface 13.

For graphite sheet 11, a pyrolytic graphite sheet, a black lead sheet, or the like, is used. Furthermore, graphite sheet 11 may be formed by laminating at least any of pyrolytic graphite sheets or black lead sheets.

The pyrolytic graphite sheet is formed by firing a polymer film at a high temperature. For the polymer film, for example, a heat-resistant aromatic polymer such as polyimide, polyamide, and polyamide-imide can be used. Interval "d" of the pyrolytic graphite sheet shown in FIG. 3 is $3.354 \times 10^{-8}$ cm to $3.356 \times 10^{-8}$ cm. Furthermore, the pyrolytic graphite sheet can have the anisotropic thermal conductivity in the main surface direction of 500 W/mK to 1800 W/mK and the thermal conductivity in the thickness direction of 10 W/mK to 15 W/mK.

The black lead sheet is a laminate formed by pressure-forming black lead as a main component. Examples of the black lead may include scale-like or spherical-shaped black lead powder of, for example, expanded black lead or pyrolytic black lead obtained by heat treating powder coke at a temperature of about 3000° C. The black lead sheet may contain a small amount of binders such as resin to improve the sheet strength. When the expanded black lead is used, it is possible to obtain a black lead sheet having a high thermal conductivity because the expanded black lead has plasticity and can be pressure-formed without using a binder. Furthermore, it is preferable that 98 weight % or more of carbon is contained to obtain a black lead sheet with high thermal conductivity.

The pyrolytic graphite sheet and black lead sheet have flexibility and can easily achieve adhesion with respect to a heat sink or a semiconductor package. In particular, since the pyrolytic graphite sheet has a higher pressure-resistant strength as compared with the black lead sheet, it can increase the adhesion and enhance an effect of preventing leakage of a fluid heat radiating member.

Graphite sheet 11 has one or more first concave portions 14 and second concave portions 15, respectively.

It is preferable that first concave portions 14 are provided on first main surface 12 and second concave portions 15 are provided on second main surface 13 in such a manner that they are dispersed uniformly. Thus, the fluid heat radiating member can be reliably dispersed on first main surface 12 and second main surface 13, so that the heat radiation performance can be enhanced.

It is preferable that first concave portion 14 is provided such that the area ratio of opened surface 16 of first concave portion 14 to first main surface 12 is in the range from 30% to 70%. Thus, the fluid heat radiating member can be filled in the through hole and prevented from leaking. Furthermore, since the opened area of opened surface 16 can be increased, the contact thermal resistance with respect to the fluid heat radiating member can be reduced. Furthermore, it is preferable that second concave portion 15 is provided such that an area ratio of opened surface 17 of second concave portion 15 to second main surface 13 is in the same range as that of opened surface 16 of first concave portion 14. That is to say, it is preferable that second concave portion 15 is provided such that the area ratio of opened surface 17 of second concave portion 15 to second main surface 13 is in the range from 30% to 70%.

Furthermore, first concave portion 14 and second concave portion 15 may have the same shape as each other or may be different shapes from each other.

Thin film portion 21 is an area in which first concave portion 14 and second concave portion 15 face each other in the thickness direction and are overlapped with each other. As shown in FIG. 2, in the cross-section, thin film portion 21 is provided such that it protrudes along at least the main surface direction, and sandwiched between first concave portion 14 and second concave portion 15.

Furthermore, thin film portion 21 is a laminate of graphite and has a high anisotropic thermal conductivity in the main surface direction. Therefore, the heat conduction in the main surface direction can be carried out rapidly. Furthermore, in thin film portion 21, since the length in the thickness direction, that is, the length in which heat is conducted from first concave portion 14 to second concave portion 15 is short, heat can be efficiently conducted between first concave portion 14 and second concave portion 15.

Figure 4:
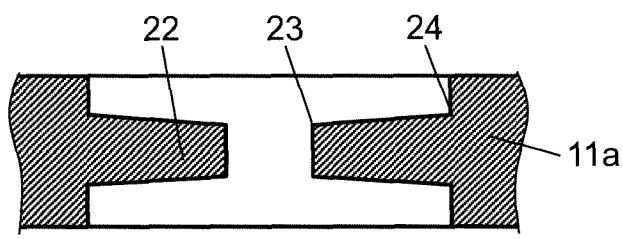
FIG. 4 is a sectional view showing a principal part of another graphite sheet in accordance with one exemplary embodiment of the present invention.

Furthermore, FIG. 4 is a sectional view showing a principal part of another graphite sheet in accordance with the exemplary embodiment. As shown in FIG. 4, thin film portion 22 may be provided in such a manner that the thickness is larger from tip end 23 to bottom part 24. Thus, the mechanical strength of thin film portion 22 can be enhanced. When graphite sheet 11a is attached between the semiconductor package and the heat sink or when graphite sheet 11a is pressurized or allowed to adhere in a thermal connection structure, breakage of thin film portion 22 can be reduced. The surface of thin film portion 22 can be provided step-wise or in an inclined form.

Figure 5:
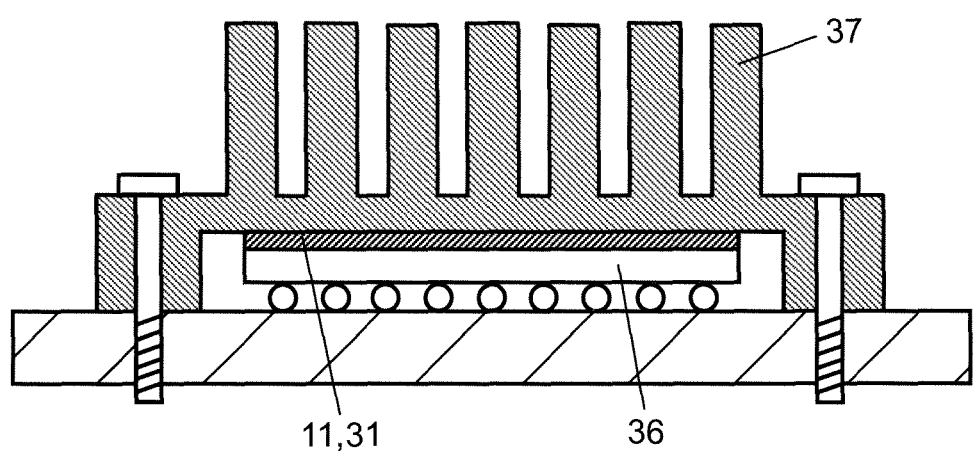
FIG. 5 is a side sectional view showing a heat transfer structure using a graphite sheet in accordance with one exemplary embodiment of the present invention.
Figure 6:
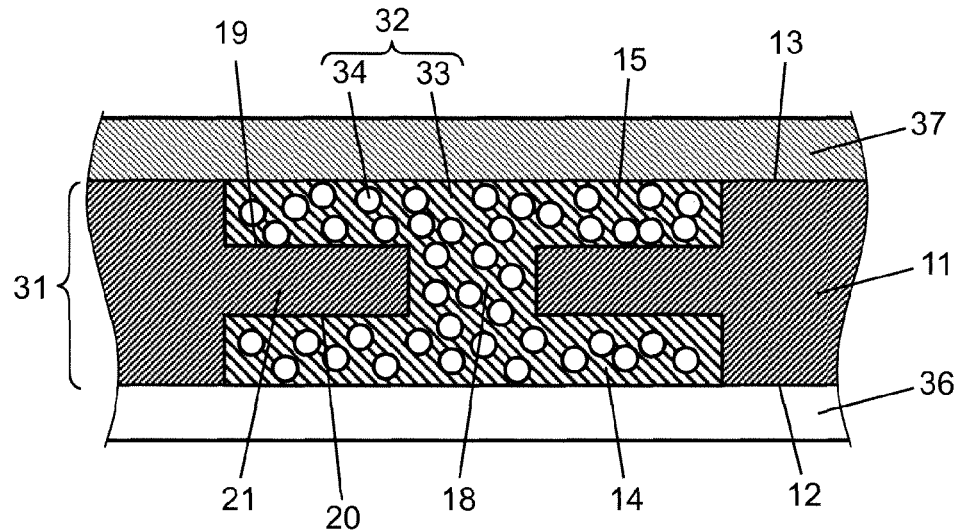
FIG. 6 is a sectional view showing a principal part of the heat transfer structure using the graphite sheet in accordance with one exemplary embodiment of the present invention.

Next, a heat transfer structure, in particular, a thermal connection portion, which uses a graphite sheet in accordance with one exemplary embodiment of the present invention is descried. FIG. 5 is a side sectional view showing a heat transfer structure using a graphite sheet in accordance with one exemplary embodiment of the present invention. FIG. 6 is a sectional view showing a principal part of the heat transfer structure using a graphite sheet in accordance with one exemplary embodiment of the present invention. As shown in FIGS. 5, and 6, thermal connection portion 31 constituting the heat transfer structure includes graphite sheet 11 and heat radiating member 32. Thermal connection portion 31 is sandwiched between a flat-shaped upper surface of semiconductor package 36 as a heat generator and a lower surface of heat sink 37 as a heat radiator. Thermal connection portion 31 is disposed in such a manner that first main surface 12 of graphite sheet 11 is provided at semiconductor package 36 side.

In a through hole made by first concave portion 14, second concave portion 15 and connecting hole 18, fluid heat radiating member 32 is filled. Heat radiating member 32 enhances the effect of reducing the contact thermal resistance of thermal connection portion 31.

As fluid heat radiating member 32, thermal conductive resin 33, for example, a heat radiating grease such as silicone oil or a phase change paste is used. Furthermore, thermal conductive filler 34 is contained so as to enhance the thermal conductivity to about 1 W/mK to about 20 W/mK. The phase change paste is solid paste that is soft at ordinary temperatures, and has a softening temperature at an operative temperature of semiconductor package 36, i.e., at 40° C. to 100° C. The phase change paste becomes a low viscous matter having fluidity at the softening temperature or more. Preferable thermal conductive filler 34 is powder which has an average particle diameter of about 1 μm to 10 μm and which is formed of aluminum nitride, silver, copper, aluminum, and the like, having a large thermal conductivity.

Furthermore, as fluid heat radiating member 32, low melting point metals that melt at an operative temperature of the semiconductor package, i.e., at 40° C. to 100° C. can be used. Examples thereof may include an alloy containing tin, indium, bismuth, and the like.

First concave portion 14 and second concave portion 15 are formed by laser beam machining, punching machining, or the like, and gaps can be formed in appropriate shapes. Thus, thermal conductive filler 34 of heat radiating member 32 can be accommodated in first concave portion 14 and second concave portion 15.

It is preferable that gaps of first concave portion 14 and second concave portion 15 are provided in such a manner that opened surfaces 16 and 17 are large in order to reduce the contact thermal resistance. For example, in graphite sheet 11 shown in FIG. 6, the length in the main surface direction of opened surfaces 16 and 17 is made to be larger than the depth of the gap in the thickness direction.

Since graphite sheet 11 has flexibility, when graphite sheet 11 is pressurized, first main surface 12 and second main surface 13 adhere to semiconductor package 36 and heat sink 37, respectively. This makes it possible to suppress leakage of heat radiating member 32 from the interface between graphite sheet 11 and each of semiconductor package 36 and heat sink 37, and to prevent the occurrence of operation failure of an electric circuit due to dirt or deterioration of a printed wiring board and electronic components, or the like.

Heat of a heat spot of semiconductor package 36 is easily conducted to heat radiating member 32 of first concave portion 14 whose contact thermal resistance is small. The heat conducted from semiconductor package 36 to heat radiating member 32 of first concave portion 14 is diffused substantially isotropically and reaches thin film portion 21, and the heat is rapidly diffused in the main surface direction via thin film portion 21 and simultaneously is conducted in the thickness direction. Thus, when the heat is conducted via thin film portion 21, it can be efficiently conducted to heat radiating member 32 of second concave portion 15, thus enabling the heat radiation performance to be improved.

Furthermore, when a plurality of first concave portions 14 and second concave portions 15 are provided, by the anisotropic heat conduction of graphite sheet 11, thermal diffusion between neighboring first concave portions 14 or neighboring second concave portions 15 easily occur. Thus, the heat radiation performance can be further improved.

Furthermore, by providing connecting hole 18 in thin film portion 21, when graphite sheet 11 is used in the heat transfer structure, difference in pressure applied to the upper and lower surfaces of thin film portion 21 by heat radiating member 32 of first concave portion 14 and second concave portion 15 can be reduced via heat radiating member 32 of connecting hole 18. Therefore, it is possible to suppress the deformation or breakage of thin film portion 21 when a pressure is applied from heat radiating member 32. Furthermore, by providing connecting hole 18 in thin film portion 21, since the length of connecting hole 18 can be shortened, the pressure difference between the upper surface and the lower surface of thin film portion 21 can be further reduced. Thus, the heat radiation performance can be stabilized.

Furthermore, it is desirable that the thermal conductivity of the fluid heat radiating member is made to be larger than the thermal conductivity in the thickness direction of the graphite sheet. Thus, the heat radiation performance can be further improved.

As mentioned above, the graphite sheet in accordance with the exemplary embodiment of the present invention can maintain a fluid heat radiating member and prevent leakage, and, furthermore, can improve the heat radiation performance of the thermal connection portion.

Next, a method for manufacturing a graphite sheet in accordance with one exemplary embodiment of the present invention is described. For the graphite sheet, a pyrolytic graphite sheet is used. An example in which a polyimide film is used for a polymer film as a raw material of the pyrolytic graphite sheet is described specifically.

It is preferable that the polyimide film to be used is a film formed by stretching a gel film obtained from a polyamide acid solution. By firing such a polyimide film at 2400° C. or higher, it is possible to form a thin film pyrolytic graphite sheet having a high orientation and an extremely high thermal conductivity in the main surface direction. By using such a pyrolytic graphite sheet, the thermal conductivity of the thermal connection portion can be improved.

Furthermore, it is preferable that a polyimide film to be used has an edge-tear resistance per unit thickness of 8500 N/(20 mm·mm) to 15000 N/(20 mm·mm). Thus, it is possible to obtain a pyrolytic graphite sheet in which the orientation of the crystalline structure of graphite is high and the thermal conductivity in the main surface direction is high. Furthermore, the waviness of the pyrolytic graphite sheet can be reduced so as to enhance flatness. Furthermore, it is more preferable that the polyimide film has an edge-tear resistance per unit thickness of 9500 N/(20 mm·mm) or more. Thus, the waviness of the pyrolytic graphite sheet can be remarkably reduced. When the waviness is small in this way, it is possible to suppress wrinkles generated in the pyrolytic graphite sheet when a pyrolytic graphite sheet as the thermal connection portion is sandwiched between the heat generator and the heat radiator, so that the adhesion can be improved. Thus, it is possible to reduce leakage of the fluid heat radiating member after long time use.

Figure 7:
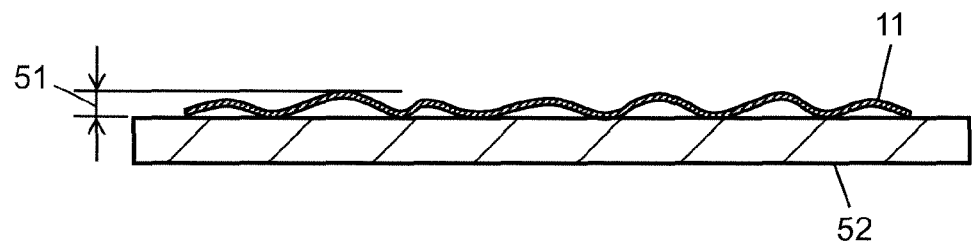
FIG. 7 is a sectional view showing waviness of a graphite sheet in accordance with one exemplary embodiment of the present invention.
Figure 8:
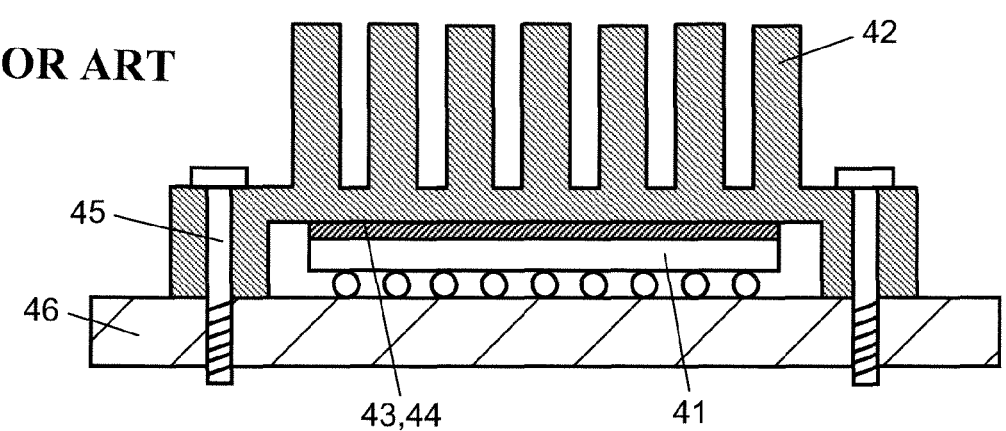
FIG. 8 is a side sectional view showing a heat transfer structure using a conventional graphite sheet.

Herein, the edge-tear resistance is measured according to the method B of JIS C2151 by using a polyimide film test piece having a width of 20 mm and a length of about 200 mm. The edge-tear resistance per unit thickness is a value obtained by dividing the edge-tear resistance by the film thickness. Furthermore, the waviness of the pyrolytic graphite sheet appears as a wave shape having waviness height 51 when the main surface of graphite sheet 11 is placed on plate 52 without applying a load on graphite sheet 11 as shown in FIG. 7.

It is preferable that the polyimide film has a film thickness of 30 μm to 150 μm. The use of such a polyimide film makes it possible to obtain a flat pyrolytic graphite sheet having a high thermal conductivity.

The polyimide film is formed by the following method. Firstly, equal moles of at least one aromatic acid dianhydride and at least one diamine are dissolved in an organic solvent to obtain a polyamide acid solution. Next, the polyamide acid solution is applied on the support medium to a uniform thickness, followed by drying by heating so as to partially imidize thereof. Thus, a gel film containing 10 to 50 weight % solid part and being capable of self supporting is obtained.

Furthermore, a gel film may be formed by mixing a cyclizing catalyst and a dehydrating agent into the polyamide acid solution.

Specific examples of aromatic acid dianhydride may include pyromellitic acid dianhydride, 3,3',4,4'-biphenyltetracarboxylic acid dianhydride, 2,3',3,4'-biphenyltetracarboxylic acid dianhydride, 3,3',4,4'-benzophenonetetracarboxylic acid dianhydride, 2,3,6,7-naphthalene dicarboxylic acid dianhydride, 2,2-bis(3,4-dicarboxyphenyl)ether dianhydride, pyridine-2,3,5,6-tetracarboxylic acid dianhydride, amide-forming derivatives thereof, and the like.

Specific examples of diamine include paraphenylenediamine, metaphenylenediamine, benzidine, para-xylene diamine, 4,4'-diaminodiphenyl ether, 4,4'-diaminodiphenylmethane, 4,4'-diaminodiphenylsulfone, 3,3'-dimethyl-4,4'-diaminodiphenylmethane, 1,5-diaminonaphthalene, 3,3'-dimethoxybenzidine, 1,4-bis(3 methyl-5 aminophenyl)benzene, amide-forming derivatives thereof, and the like.

The gel film is peeled off from the support medium, and stretched in the machine direction (MD direction) at a force of about 500 N/m to about 2000 N/m by using a nip roll. Then, the gel film is stretched in the transverse direction (TD direction) while the gel film is grasped at both ends in the width direction of the gel film by using a tenter clip of a tenter device. In this way, the gel film is stretched in the biaxial direction. Furthermore, stretching may be carried out in the directions of two axes simultaneously.

By increasing the magnification of stretching, the molecular orientation in the film plane direction of the polyimide film can be enhanced, and the edge-tear resistance per unit thickness can be increased.

It is preferable that the polyimide film is formed by using pyromellitic acid dianhydride as aromatic acid dianhydride, and 4,4'-diamino diphenyl ether as diamine. Thus, a high stretching magnification can be achieved and the edge-tear resistance per unit thickness can be increased.

Next, after the gel film is stretched, it is dried and heat treated to be imidized so as to obtain a polyimide film.

Then, the polyimide film is cut into a predetermined dimension and the polyimide film is placed and fired in a holding vessel made of graphite.

Firstly, the polyimide film is heated from room temperature to a firing temperature set in the range from 1200° C. to 1500° C. at a constant heating rate of 1° C./min to 10° C./min in an atmosphere of an inert gas such as nitrogen and argon, or in a vacuum nonoxidative atmosphere. At this firing temperature, the polyimide film is carbonized for 30 minutes to two hours. In the firing step in carbonization, the polyimide film is thermally decomposed and elements other than carbon are released. As a result, a carbon-carbon bond is carried out again and the polyimide film is fired and contracted.

Next, the carbonized sheet is heated to a firing temperature that is a maximum temperature set in the range from 2400° C. to 3500° C. at a constant heating rate of 1° C./min to 10° C./min in an atmosphere of an inert gas such as nitrogen and argon, or in a vacuum non-oxidative atmosphere. At this firing temperature, the sheet is held and fired for 30 minutes to two hours and graphitized. In the firing step in graphitizing, the carbon-carbon bond is converted into a graphite crystal.

When the firing temperature in the graphitizing step is less than 2400° C., the polyimide film is not graphitized sufficiently, so that excellent graphite crystals cannot be formed and the heat conductivity is small.

It is preferable that the fired pyrolytic graphite sheet is then subjected to a rolling process in a state in which it is sandwiched between rollers. This rolling process can improve the flexibility and enhance the thermal conductivity by increasing the density of the pyrolytic graphite sheet after firing. Furthermore, by the rolling process, the waviness is further reduced by keeping the size relation of the height of the waviness in pyrolytic graphite sheet after firing.

Next, the pyrolytic graphite sheet after firing or the graphite sheet that is subjected to rolling process after firing is irradiated with laser in the air so as to oxidize and eliminate graphite. Thus, first concave portion 14, second concave portion 15 and connecting hole 18 are formed.

Formation of first concave portion 14 and second concave portion 15 with laser irradiation makes it possible to keep the density of pyrolytic graphite sheet in regions of first concave portion 14 and second concave portion 15 and that in the regions other than the regions uniform as compared with a case of compressing a pyrolytic graphite sheet by a mechanical method such as punching to form a concave portion. That it so say, it is possible to make the density uniform in all areas of the graphite sheet. Therefore, when a graphite sheet is pressurized, the entire pyrolytic graphite sheet is compressed uniformly in the heat transfer structure. Therefore, it is possible to reduce the reduction of the gap volume of first concave portion 14 and second concave portion 15 and to enhance the effect of preventing leakage of thermal conductive filler.

EXAMPLE

The graphite sheet of this exemplary embodiment is specifically described with reference to FIGS. 1 and 2.

Firstly, a polyimide film whose edge-tear resistance per unit thickness is 9500 N/(20 mm·mm) is fired in nitrogen gas by setting a maximum temperature at 3000° C. Thereafter, the polyimide film is rolled at a pressure of 0.3 MPa so as to form a rectangular pyrolytic graphite sheet in which each side of first main surface 12 and second main surface 13 is 15 mm to 50 mm and a thickness is 17 μm. In this pyrolytic graphite sheet, the thermal conductivity in the main surface direction and in the thickness direction is 1750 W/mK and 15 W/mK, respectively, and the waviness height is 7 μm or less.

Next, by irradiating the pyrolytic graphite sheet with scanning YAG laser, first concave portion 14 is formed on first main surface 12. First concave portion 14 has a square, plate-shaped gap having the sides of 0.8 mm to 1.0 mm and the depth of 4 μM to 6 μm. An appropriate number of first concave portions 14 are provided according to the dimension of first main surface 12 so that the area ratio of the total area of opened surface 16 to the area of first main surface 12 is 40% to 60%. In this Example, first concave portions 14 are arranged to be formed in equal intervals in the width direction and in the length direction of second main surface 13. Thus, lattice-shaped barriers 25 are formed on first main surface 12. Next, second concave portions 15 are formed in the same shape as first concave portions 14. Second concave portion 15 is formed in such a manner that first concave portion 14 and second concave portion 15 are overlapped with each other almost entirely in a plane seen from the vertical direction with respect to the main surface. Thereafter, the center of the bottom surface of first concave portion 14 is irradiated with laser and annular connecting hole 18 with diameter of 0.3 mm, which is penetrating perpendicular to first main surface 12, is formed one by one on each of first concave portions 14. Then, thin film portion 21 is formed on a plate having a thickness of 5 μm to 9 μm in parallel to first main surface 12 and second main surface 13.

INDUSTRIAL APPLICABILITY

A graphite sheet of the present invention has an effect of improving heat radiation performance of a thermal connection portion, and is useful for a heat radiation sheet used for thermal connection between a heat generator and a heat radiator.

The invention claimed is:

1. A graphite sheet comprising a first main surface and a second main surface opposite to the first main surface and having a large anisotropic thermal conductivity in a main surface direction,
the graphite sheet further comprising:
a first concave portion provided on the first main surface and having a first bottom surface;
a second concave portion provided on the second main surface and having a second bottom surface;
a thin film portion formed in a region in which the first bottom surface and the second bottom surface are overlapped with each other; and
a connecting hole penetrating the thin film portion and allowing the first concave portion and the second concave portion to communicate with each other,
wherein the thin film portion is provided in such a manner that a thickness is increased from a tip end to a bottom part in the thin film portion.

2. The graphite sheet of claim 1,
wherein the graphite sheet is produced by firing a polymer film.

3. The graphite sheet of claim 2,
wherein the polymer film is a polyimide film, and an edge-tear resistance per unit thickness of the polyimide film is 8500 N/(20 mm·mm) to 15000 N/(20 mm·mm).

4. The graphite sheet of claim 1,
wherein a density is uniform in all areas.

5. The graphite sheet of claim 4,
wherein the first concave portion and the second concave portion are formed by laser irradiation.

6. A heat transfer structure that comprises a thermal connection portion,
the thermal connection portion comprising:
a graphite sheet which includes:
a first main surface;
a second main surface opposite to the first main surface;
a first concave portion provided on the first main surface and having a first bottom surface;
a second concave portion provided on the second main surface and having a second bottom surface;
a thin film portion formed in a region in which the first bottom surface and the second bottom surface are overlapped with each other; and
a connecting hole penetrating the thin film portion and allowing the first concave portion and the second concave portion to communicate with each other, and
which has a larger anisotropic thermal conductivity in a main surface direction, and
a fluid heat radiating member filled in the first concave portion, the second concave portion and the connecting hole,
wherein the thermal connection portion is disposed in such a manner that a heat generator is brought into contact with the first main surface side of the graphite sheet.

7. The heat transfer structure of claim 6,
wherein a thermal conductivity of the fluid heat radiating member is made to be larger than a thermal conductivity in a direction perpendicular to the main surface direction of the graphite sheet.

8. A graphite sheet comprising a first main surface and a second main surface opposite to the first main surface and having a large anisotropic thermal conductivity in a main surface direction,
the graphite sheet further comprising:
a first concave portion provided on the first main surface and having a first bottom surface;
a second concave portion provided on the second main surface and having a second bottom surface;
a thin film portion formed in a region in which the first bottom surface and the second bottom surface are overlapped with each other; and
a connecting hole penetrating the thin film portion and allowing the first concave portion and the second concave portion to communicate with each other, wherein:

the graphite sheet is produced by firing a polyimide film, and an edge-tear resistance per unit thickness of the polyimide film is 8500 N/(20 mm·mm) to 15000 N/(20 mm·mm).

9. The graphite sheet of claim 8, wherein a density is uniform in all areas.

10. The graphite sheet of claim 9, wherein the first concave portion and the second concave portion are formed by laser irradiation.

\* \* \* \* \*